(12) United States Patent
Chang

(10) Patent No.: US 7,874,852 B2
(45) Date of Patent: Jan. 25, 2011

(54) COVER STRUCTURE FOR PORTABLE ELECTRONIC DEVICES

(75) Inventor: Cheng-Lung Chang, Tu-Cheng (TW)

(73) Assignee: Chi Mei Communication Systems, Inc., Tu-Cheng, Taipei County (TW)

( * ) Notice: Subject to any disclaimer, the term of this patent is extended or adjusted under 35 U.S.C. 154(b) by 0 days.

(21) Appl. No.: 12/578,144

(22) Filed: Oct. 13, 2009

(65) Prior Publication Data

US 2010/0311259 A1    Dec. 9, 2010

(51) Int. Cl.
*H01R 13/44*    (2006.01)

(52) U.S. Cl. .................................................... 439/140

(58) Field of Classification Search ................ 439/76.1, 439/135, 136, 140, 660
See application file for complete search history.

(56) References Cited

U.S. PATENT DOCUMENTS

2008/0298025 A1* 12/2008 Chang et al. ................. 361/727
2009/0269662 A1* 10/2009 Chang ......................... 429/175

* cited by examiner

*Primary Examiner*—Javaid Nasri
(74) *Attorney, Agent, or Firm*—Steven M. Reiss

(57) ABSTRACT

A cover structure includes a cover, a main body and an elastic member. The cover includes an engaging portion and a sliding member. The main body includes a latching portion. The elastic member is integrally formed with the main body. The elastic member defines a sliding hole allowing the sliding member to slide therein. At least one protrusion is formed in the sliding hole and divides the sliding hole into two sections. The sliding member passes the protrusion from one section to another section of the sliding hole while the engaging portion is engaged in or detached from the latching portion.

20 Claims, 6 Drawing Sheets

COVER STRUCTURE FOR PORTABLE ELECTRONIC DEVICES

BACKGROUND

1. Technical Field

The present disclosure relates to cover structures, particularly, to a cover structure for portable electronic device.

2. Description of Related Art

Detachable covers, such as battery covers, camera covers etc., are widely used in portable electronic devices. A cover structure is applied to connect the cover to a housing of the portable electronic device. A conventional cover structure includes a plurality of hooks formed on the cover and a plurality of latching portions formed on the housing. The hooks are engaged in the latching portions to fix the cover to the housing. However, there is a lack of tactile feedback and so users cannot feel when the hooks are properly engaged in the latching portions.

Therefore, there is room for improvement within the art.

BRIEF DESCRIPTION OF THE DRAWINGS

Many aspects of the cover structure can be better understood with reference to the following drawings. The components in the drawings are not necessarily drawn to scale, the emphasis instead being placed upon clearly illustrating the principles of the cover structure. Moreover, in the drawings, like reference numerals designate corresponding parts throughout the several views, in which.

DETAILED DESCRIPTION

Figure 1:
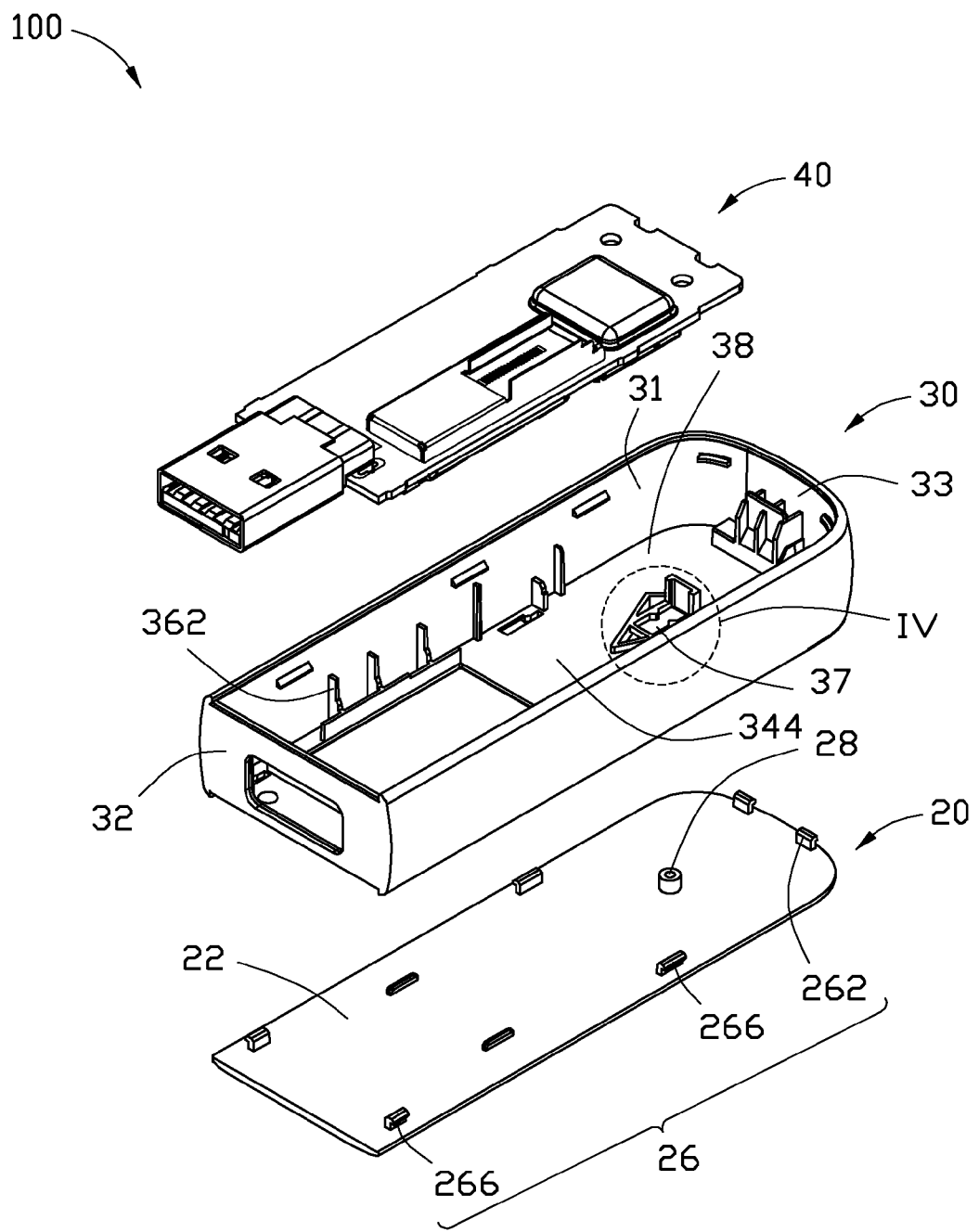
FIG. 1 is an exploded, schematic view of a cover structure, in accordance with an exemplary embodiment.
Figure 2:
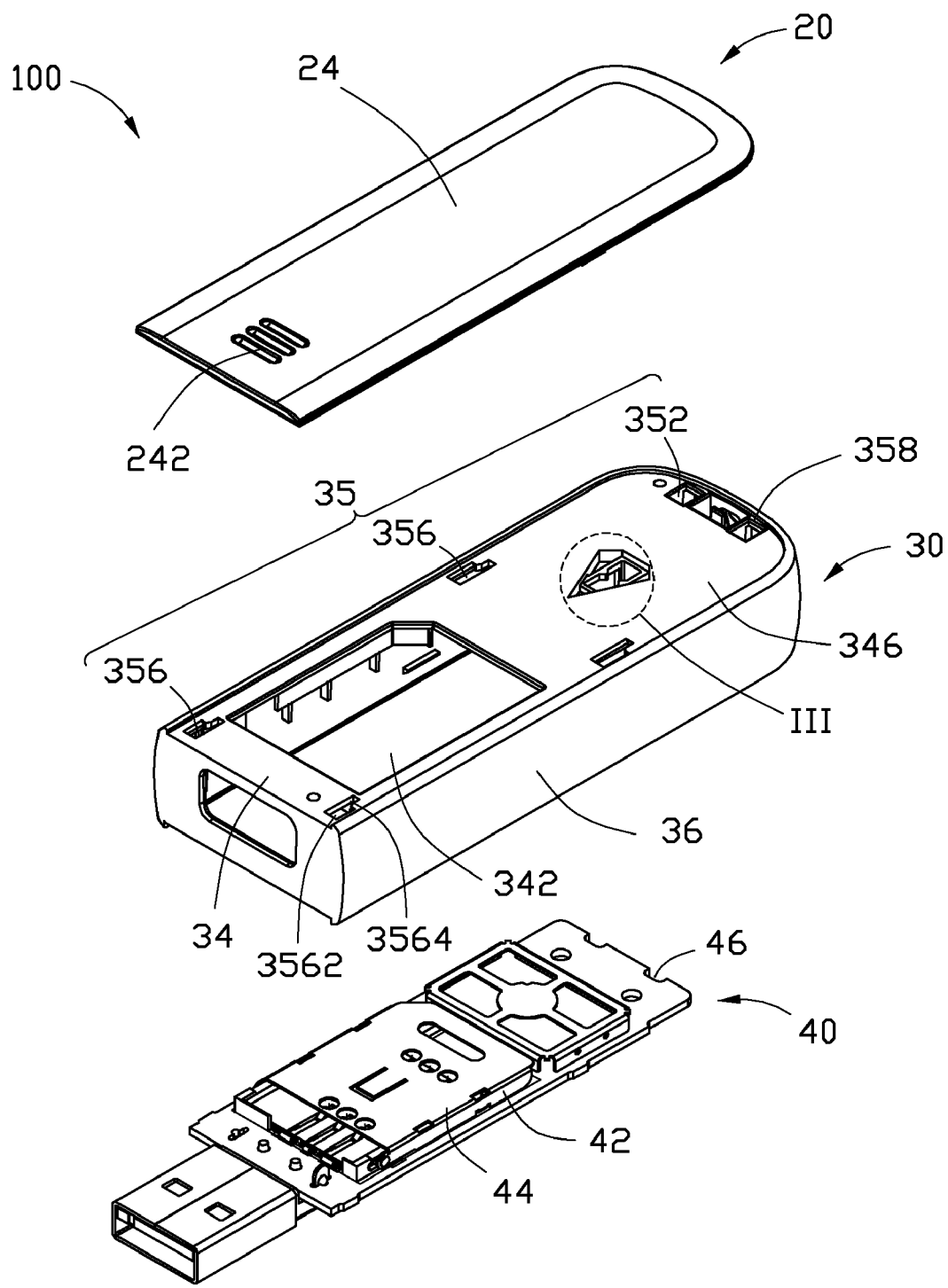
FIG. 2 is similar to FIG. 1, but shown from another aspect.

FIGS. 1-2 shows an exemplary embodiment of a cover structure 100 applied to a portable electronic device (not labeled), such as Universal Serial Bus plug. The portable electronic device includes a cover 20, a main body 30, and a printed circuit board 40.

The cover 20 includes a bottom surface 22 and a top surface 24. An operating portion 242 is formed on one end of the top surface 24 for easily and manually pushing the cover 20 to attach to or detach from the main body 30. An engaging portion 26 is formed on the bottom surface 22, including two first hooks 262 and four second hooks 266. The first hooks 262 are positioned at one end portion of the cover 20 spaced from the operating portion 242. Each two second hooks 266 are symmetrically positioned at one side of the bottom surface 22. A sliding member 28 is formed on the bottom surface 22 adjacent to the first hooks 262. In this embodiment, the sliding member 28 is columnar.

The main body 30 defines a cavity 31 for receiving the printed circuit board 40, and the cavity 31 is cooperatively surrounded by two end walls 32, 33, two side walls 36 and a bottom portion 34. A plurality of ribs 362 are formed on an inner surfaces of each side wall 36 to support the printed circuit board 40. The bottom portion 34 includes a latching portion 35 for engaging with the engaging portion 26 of the cover 20. The latching portion 35 includes a plurality of slots 356 and two latching holes 352. The slots 356 are positioned at two sides of the bottom portion 34 and the two latching holes 352 are positioned at an end portion of the bottom portion 34. The first hooks 262 are respectively slidably engagable in the latching holes 352, and the second hooks 266 are respectively slidably engagable in the slots 356. The slots 356 are L-shaped, and each slot 356 is divided into an inserting hole 3562 and a locking hole 3564. The inserting holes 3562 respectively allow the second hooks 266 to extend therethrough. A width of the locking hole 3564 is smaller than that of the inserting hole 3562 so as to prevent the second hook 266 from accidentally separating from the main body 30. A block 358 is formed on an inner surface of the end wall 33 beneath each latching hole 352, for locking the first hooks 262 in place. The bottom portion 34 defines a receiving hole 342 for installing a card 44, such as memory card 44, subscriber identity module, etc., on the printed circuit board 40.

Figure 3:
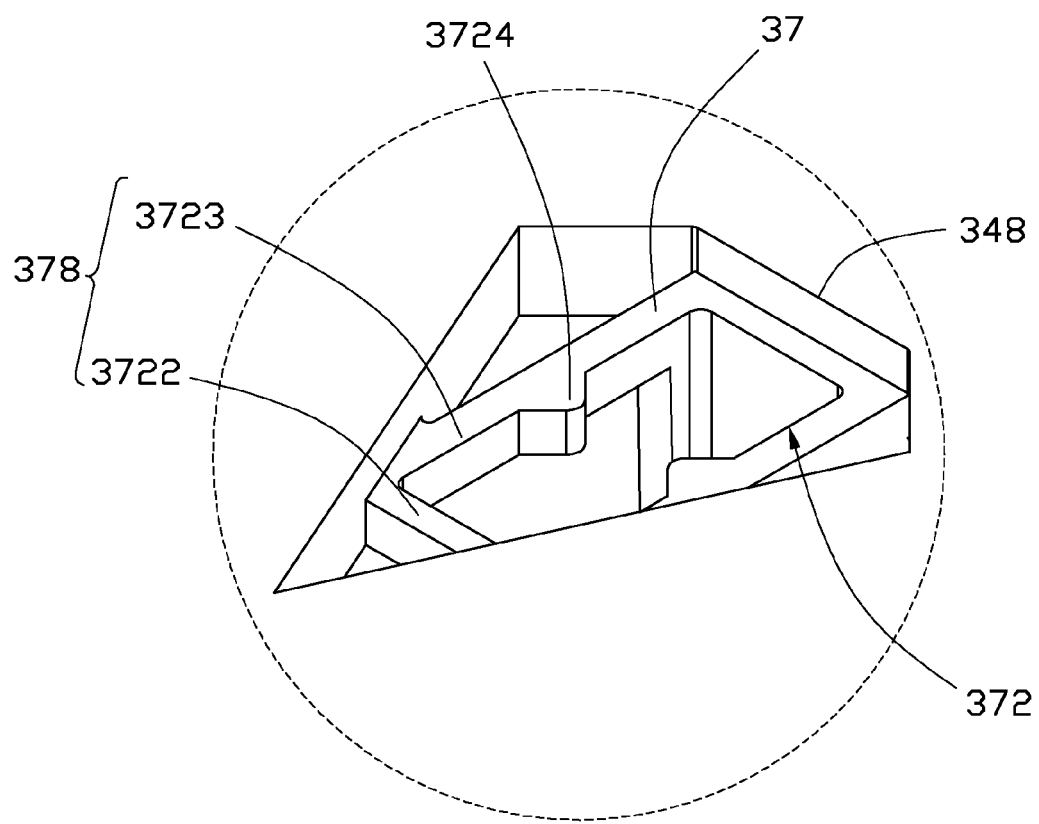
FIG. 3 is an enlarged view of a circled portion III of FIG. 2.
Figure 4:
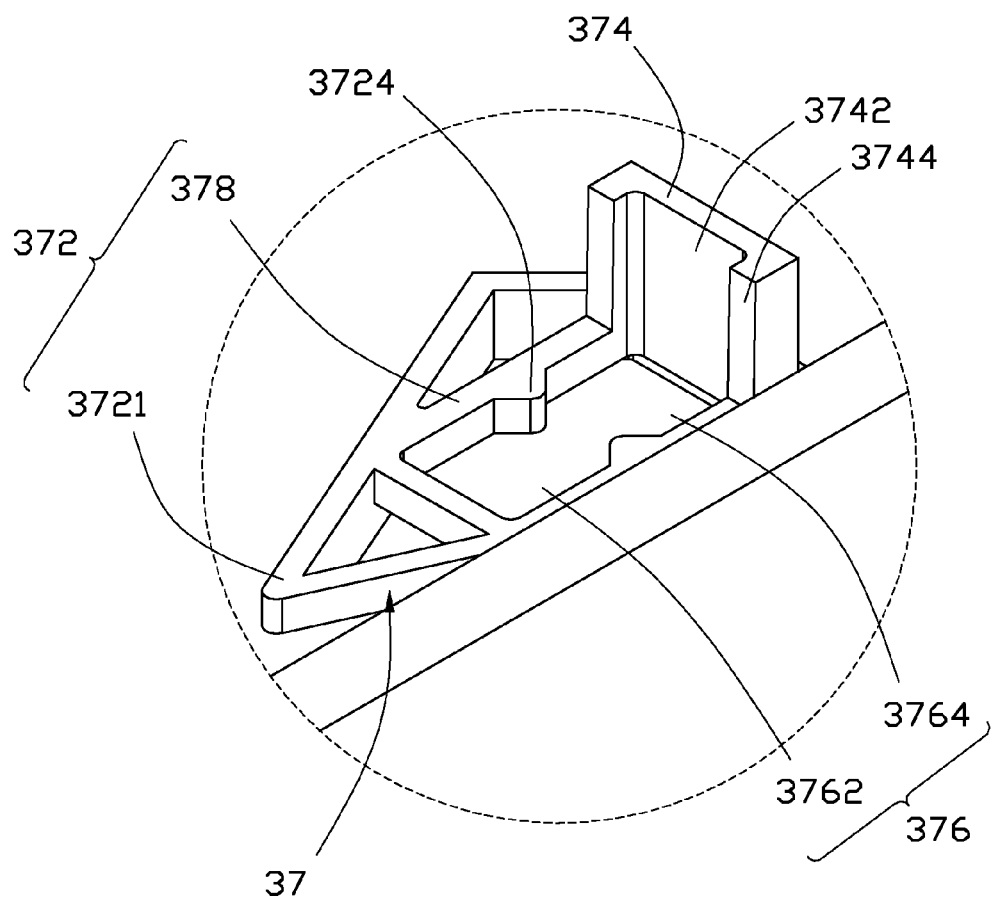
FIG. 4 is an enlarged view of a circled portion IV of FIG. 1.
Figure 5:
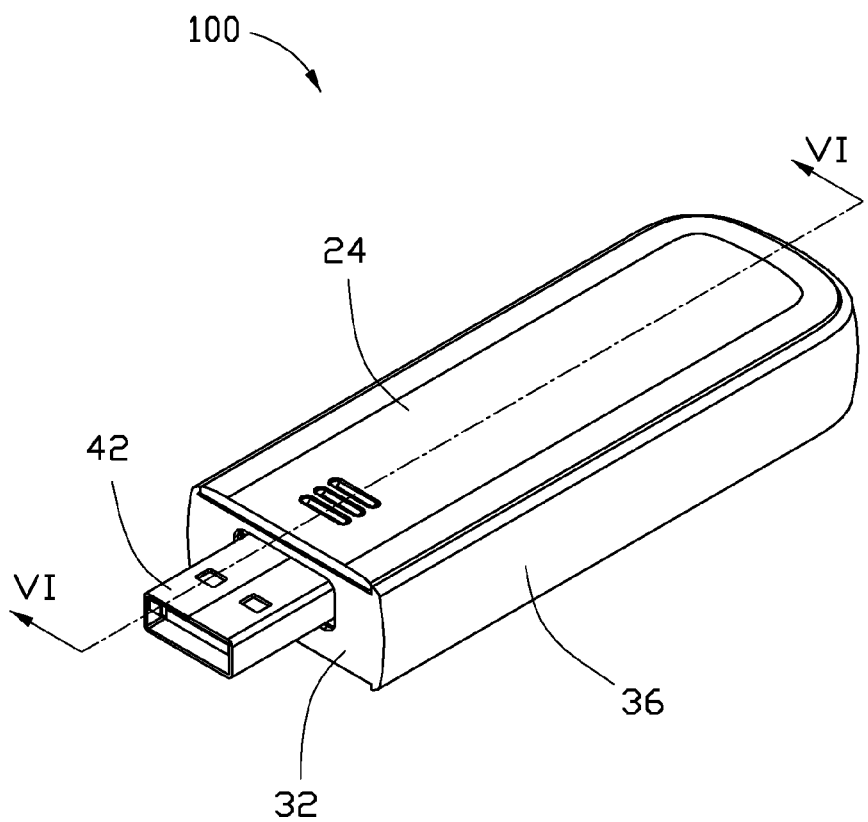
FIG. 5 is an assembled, schematic view of the cover structure shown in FIG. 1.
Figure 6:
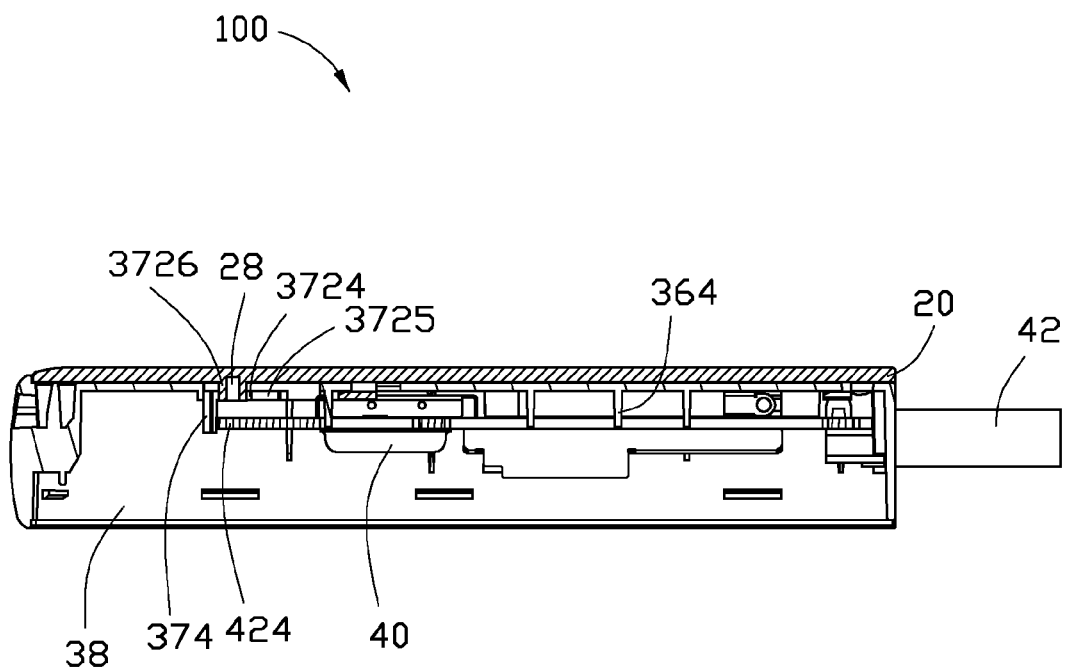
FIG. 6 is a cross-sectional view taken along line VI-VI of FIG. 5.

Also referring to FIGS. 3-4, the bottom portion 34 defines an irregular through hole 348 between the latching holes 352 and the receiving hole 342. An elastic member 37 is integrally formed with the main body 30, extending through the through hole 348. The elastic member 37 includes a seat 372 and an extending portion 374 vertically extending from one end of the seat 372.

The seat 372 includes an outer frame 3721 and an inner frame 378. The inner frame 378 includes two substantially parallel longitudinal strips 3723 and a transverse strip 3722. The outer frame 3721 and the extending portion 374 abut sidewalls surrounding the through hole 348. The transverse strip 3723 and the extending portion 374 respectively connect ends of the two longitudinal strips at two opposite sides. The corners of the inner frame 378 respectively join to the outer frame 3721. The inner frame defines a sliding hole 376 allowing the sliding member 28 to slide along therein from one position to another. A protrusion 3724 extends from a middle portion of each longitudinal strip 3723 toward the other longitudinal strip 3723, so that the two protrusions 3724 divide the sliding hole 376 into a first section 3762 and a second section 3764. The sliding member 28 is slidably engagable in the first section 3762 and the second section 3764. A distance between the two protrusions 3724 is shorter than a diameter of the sliding member 28. However, since the protrusions 3724 and the longitudinal strips 3723 are elastic, the sliding member 28 can be pushed to pass through the space between the two protrusions 3724.

The extending portion 374 vertically defines a groove 3742 communicating with the sliding hole 376, so as to form two bars 3744 at two sides. The extending portion 374 is configured for stopping the printed circuit board 40 from moving.

The printed circuit board 40 defines two spaced notches 46 at an end edge thereof for receiving the two bars 3744 to position printed circuit board 40. A retaining portion 42 is formed on the printed circuit board 40 for receiving the card 44. The retaining portion 42 is engaged in the receiving hole 342 of the bottom portion 34 when the printed circuit board 40 is fixed to the main body 30, so that the card 44 can be installed through the receiving hole 342.

In assembly of the portable electronic device 100, the printed circuit board 40 is received in the cavity 31 of the main body 30, and supported by the ribs 362 on the side walls 36 of the main body 30. The card 44 in the retaining portion 42 is disposed through the receiving hole 342 of the main body 30. The two bars 3744 of the elastic member 37 are respectively engaged in the notches 46 of the printed circuit board 40 so as to stop the printed circuit board 40 from moving when the card 44 is installed through the receiving hole 342. The cover 20 is laid on the outer surface of the bottom portion 34. The first hooks 262 are respectively inserted into the latching holes 352, and the second hooks 266 are inserted into the inserting holes 3562 of the slots 356, with the sliding member 28 received in the first section 3762 of the sliding hole 376. The cover 20 is then pushed toward the end wall 33 using the operating portion 242 until the first hooks 262 are locked by the blocks 358 on the end wall 33. The second hooks 266 are locked in the locking holes 3564 of the slots 356. The sliding member 28 is pushed to pass the two protrusions 3724 and is then received in the second section 3764 of the sliding hole 376. In this process, user feels a resistance when pushing the sliding member 28 past the two protrusions 3724 and suddenly feels the resistance end when the sliding member 28 is received in the second section 3764 of the sliding hole 376 and then knows the action is successfully completed.

When the card 44 is replaced, the cover 20 is pushed toward the end wall 31 using the operating portion 242. The sliding member 28 passes the two protrusions 3724 and slides into the first section 3762 of the sliding hole 376, while the first hooks 262 are detached from the blocks 358 and the second hooks 266 respectively slide from the locking holes 3564 to the inserting holes 3562. Thus, the cover 20 can be detached from the main body 30 so as to install the card 44 through the receiving hole 342 of the main body 30.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A cover structure comprising:
    a cover including an engaging portion and a sliding member;
    a main body including a latching portion; and
    an elastic member integrally formed with the main body, the elastic member defining a sliding hole allowing the sliding member to slide therein, the elastic member including at least one protrusion to divide the sliding hole into two sections, the sliding member passing the protrusion to move from one section to another section of the sliding hole when the engaging portion is engaged with or detached from the latching portion.

2. The cover structure as claimed in claim 1, further comprising a printed circuit board in the main body, wherein the elastic member comprises an extending portion for preventing the printed circuit board from moving.

3. The cover structure as claimed in claim 2, wherein the printed circuit board defines at least one notch at an edge thereof, and the extending portion includes at least one bar engaged in the notch.

4. The cover structure as claimed in claim 3, wherein there are two notches and two bars, and the two bars are positioned at two sides of the extending portion.

5. The cover structure as claimed in claim 2, wherein the elastic member further comprises a seat, the sliding hole is defined in the seat, and the extending portion vertically extends from one end of the seat.

6. The cover structure as claimed in claim 5, wherein the main body further comprises a bottom portion, the bottom portion defines a through hole, the seat comprises an outer frame, and the outer frame and the extending portion abuts sidewalls surrounding the through hole.

7. The cover structure as claimed in claim 6, wherein there are two protrusions, the seat further comprises two longitudinal strips, the two protrusions are respectively formed on the longitudinal strips facing each other.

8. The cover structure as claimed in claim 7, wherein the seat further comprises a transverse strip, and the sliding hole is surrounded by the transverse strip, the longitudinal strips and the extending portion.

9. The cover structure as claimed in claim 6, wherein the bottom portion defines a receiving hole for receiving a card on the printed circuit board.

10. The cover structure as claimed in claim 9, wherein the engaging portion includes two first hooks at an end portion of the cover and a plurality of second hooks at two sides of the cover, the latching portion defines two latching holes and a plurality of slots, the first hooks are respectively, slidably engaged in the latching holes, and the second hooks are respectively, slidably engaged in the slots.

11. A cover structure comprising:
    a cover including an engaging portion and a sliding member;
    a main body including a latching portion, the cover being attached to the main body by engagement of the engaging portion and the latching portion; and
    a guiding member fixed to the main body, the guiding member defining two communicating holes, the sliding member sliding from one hole to another hole when the cover is attached to or detached from the main body, the guiding member including at least one elastic protrusion positioned between the two holes to resist the sliding member when the sliding member slides from one hole to another hole.

12. The cover structure as claimed in claim 11, further comprising a printed circuit board in the main body, wherein the guiding member comprises an extending portion for preventing the printed circuit board from moving.

13. The cover structure as claimed in claim 12, wherein the printed circuit board defines at least one notch at an edge thereof, and the extending portion includes at least one bar engaged in the notch.

14. The cover structure as claimed in claim 13, wherein there are two notches and two bars, and the two bars are positioned at two sides of the extending portion.

15. The cover structure as claimed in claim 12, wherein the guiding member further comprises a seat, the sliding hole is defined in the seat, and the extending portion vertically extends from one end of the seat.

16. The cover structure as claimed in claim 15, wherein the main body further comprises a bottom portion, the bottom portion defines a through hole, the seat comprises an outer frame, and the outer frame and the extending portion are integrally formed with sidewalls surrounding the through hole.

17. The cover structure as claimed in claim 16, wherein there are two protrusions, the seat further comprises two longitudinal strips, the two protrusions are respectively formed on the longitudinal strips facing each other.

18. The cover structure as claimed in claim 17, wherein the seat further comprises a transverse strip, and the sliding hole is surrounded by the transverse strip, the longitudinal strips and the extending portion.

19. The cover structure as claimed in claim 16, wherein the bottom portion defines a receiving hole for receiving a card on the printed circuit board.

20. The cover structure as claimed in claim 19, wherein the engaging portion includes two first hooks at an end portion of the cover and a plurality of second hooks at two sides of the cover, the latching portion defines two latching holes and a plurality of slots, the first hooks are respectively, slidably engaged in the latching holes, and the second hooks are respectively, slidably engaged in the slots.

* * * * *